US010367174B2

(12) United States Patent
Ishikawa et al.

(10) Patent No.: US 10,367,174 B2
(45) Date of Patent: Jul. 30, 2019

(54) MANUFACTURING METHOD OF A LIGHT EMITTING DEVICE

(71) Applicant: Japan Display Inc., Tokyo (JP)

(72) Inventors: Takaaki Ishikawa, Tokyo (JP); Takaaki Kamimura, Tokyo (JP); Noriyuki Hirata, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 16/162,528

(22) Filed: Oct. 17, 2018

(65) Prior Publication Data

US 2019/0051867 A1   Feb. 14, 2019

Related U.S. Application Data

(63) Continuation of application No. 15/644,923, filed on Jul. 10, 2017, now Pat. No. 10,164,218.

(30) Foreign Application Priority Data

Aug. 4, 2016 (JP) ................. 2016-153361

(51) Int. Cl.
*H01L 21/677* (2006.01)
*H01L 51/56* (2006.01)
(Continued)

(52) U.S. Cl.
CPC .............. *H01L 51/56* (2013.01); *C23C 14/24* (2013.01); *C23C 14/568* (2013.01);
(Continued)

(58) Field of Classification Search
CPC . H01L 52/56; H01L 52/0021; H01L 52/0008; H01L 52/0011; H01L 52/0002;
(Continued)

(56) References Cited

U.S. PATENT DOCUMENTS

2002/0187265 A1* 12/2002 Mori ..................... C23C 14/022
427/282
2004/0261710 A1* 12/2004 Matsushita ............. C23C 16/54
118/719
(Continued)

FOREIGN PATENT DOCUMENTS

JP   2004-288463 A   10/2004
JP   2009-224231 A   10/2009
(Continued)

OTHER PUBLICATIONS

Chinese Office Action dated Nov. 2, 2018 for the corresponding Chinese patent application No. 201710662741.X, with partial English translation.
(Continued)

*Primary Examiner* — Michael M Trinh
(74) *Attorney, Agent, or Firm* — Michael Best & Friedrich LLP

(57) ABSTRACT

Disclosed is a manufacturing apparatus of a light-emitting element including: a main transporting route extending in a first direction, the main transporting route comprising first and second transfer devices connected through a first transporting chamber; a sub-transporting route extending in a second direction intersecting the first direction, the sub-transporting route comprising a second transporting chamber connected to the first or second transfer device and a delivery chamber connected to the second transfer chamber; and a plurality of first treatment chambers connected to the delivery chamber. The main transporting route is configured to transfer a substrate to be treated in a horizontal state, and one of the plurality of treatment chambers is configured to hold the substrate in a vertical state during treatment.

10 Claims, 9 Drawing Sheets

(51) Int. Cl.
  *C23C 14/56* (2006.01)
  *H01L 21/67* (2006.01)
  *C23C 14/24* (2006.01)
  *H01L 27/32* (2006.01)
  *H01L 51/00* (2006.01)

(52) U.S. Cl.
  CPC .. *H01L 21/67173* (2013.01); *H01L 21/67184* (2013.01); *H01L 21/67745* (2013.01); *H01L 21/67748* (2013.01); *H01L 21/67751* (2013.01); *H01L 27/3246* (2013.01); *H01L 51/0008* (2013.01); *H01L 51/0021* (2013.01)

(58) Field of Classification Search
  CPC ......... H01L 21/67184; H01L 21/67748; H01L 21/67751; H01L 21/67745; H01L 21/67167; H01L 21/67178; H01L 21/67742; H01L 21/67173; H01L 27/3246; C23C 14/568; C23C 14/24
  See application file for complete search history.

(56) References Cited

U.S. PATENT DOCUMENTS

| | | | |
|---|---|---|---|
| 2008/0085173 A1* | 4/2008 | van der Meulen | B25J 9/042 414/222.07 |
| 2009/0139450 A1* | 6/2009 | Ogura | H01L 21/67173 118/600 |
| 2009/0226610 A1* | 9/2009 | Koenig | C23C 14/042 427/248.1 |
| 2011/0280693 A1* | 11/2011 | Hofmeister | H01L 21/67161 414/222.13 |
| 2016/0322245 A1* | 11/2016 | Kaino | H01L 21/67736 |
| 2017/0358469 A1 | 12/2017 | Ishikawa et al. | |

FOREIGN PATENT DOCUMENTS

| | | |
|---|---|---|
| KR | 10-2010-0028479 A | 3/2010 |
| KR | 10-2013-0074307 A | 7/2013 |
| TW | 200946708 A | 11/2009 |
| TW | I463029 B | 12/2014 |

OTHER PUBLICATIONS

Korean Office Action dated Jun. 20, 2918 for corresponding Korean Patent Application No. 10-2017-10082506, with partial translation.
Korean Office Action dated Mar. 6, 2019 for the corresponding Korean patent application No. 10-2019-0021103, with partial English translation.

* cited by examiner

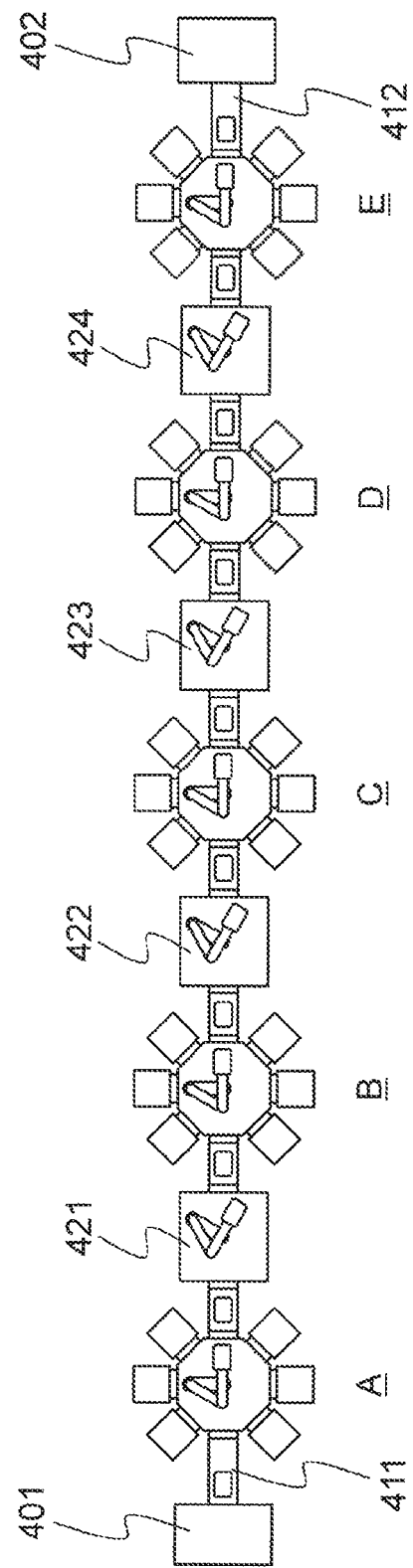

MANUFACTURING METHOD OF A LIGHT EMITTING DEVICE

CROSS REFERENCE TO RELATED APPLICATIONS

This application is a continuation of U.S. patent application Ser. No. 15/644,923 filed on Jul. 10, 2017. Further, this application is based on and claims the benefit of priority from the prior Japanese Patent Application No. 2016-153361, filed on Aug. 4, 2016, the entire contents of which are incorporated herein by reference.

FIELD

The present invention relates to a manufacturing apparatus and a manufacturing method of a light-emitting element. Particularly, the present invention relates to a manufacturing apparatus and a manufacturing method of an organic layer and an electrode layer which structure an organic EL element of a display device.

BACKGROUND

In recent years, a display device using an organic electroluminescence element (organic EL element) in a display portion has been widely employed in a variety of electronic devices including a portable information terminal such as a smartphone. An organic EL element has a structure in which organic layers having respective functions are stacked and sandwiched between a pair of electrodes. Manufacture of an organic EL element is achieved by sequentially forming, over a substrate over which one of the electrodes is fabricated, organic layers with an evaporation method, an application method, and the like and then forming the other electrode with a sputtering method, an application method, and the like.

A stacked structure of a hole-injection layer/hole-transporting layer/emission layer/electron-transporting layer/electron-injection layer is represented as a typical structure of organic layers of an organic EL element. A manufacturing apparatus for sequentially and appropriately forming stacked layers constructing an organic EL element, which are exemplified by the aforementioned stacked structure, has been proposed (for example, see Japanese patent application publication No. 2004-288463).

SUMMARY

An organic EL element is structured with a stack of organic layers sandwiched between a pair of electrodes, and its structure strongly depends on the required characteristics. Therefore, a proposal of an element having a material and a stacked-layer structure different from those of conventional organic EL elements requires construction of a manufacturing apparatus suitable for the element. For example, in the manufacturing apparatus described in the Japanese patent application publication No. 2004-288463, delivery chambers to which a plurality of treatment chambers is connected are connected in series through transporting chambers. In the case of such a structure, when the stacked-layer structure is changed or a new layer is additionally provided, a large-scale reconstruction is necessary which includes dismantling and rearranging a part of the apparatus groups already arranged or adding and connecting a new delivery chamber. Additionally, each treatment is different in treatment time. Hence, there is a difference in treatment so that a chamber may have a high treatment ability in a certain process but exhibit a poor treatment ability in another process. When delivery chambers are connected in series, a process conducted in a treatment chamber with a poor ability becomes a bottleneck and determines manufacturing throughput of the whole of the manufacturing process.

A manufacturing apparatus of stacked films according to an embodiment of the present invention includes: a main transporting route having first and second transfer devices connected through a first transporting chamber; a sub-transporting route extending in a direction intersecting the main transporting route, the sub-transporting route having a second transporting chamber connected to the first or second transfer device and a delivery chamber connected to the second transfer chamber; and a plurality of first treatment chambers connected to the delivery chamber. The main transporting route is configured to transfer a substrate to be treated in a horizontal state. One of the plurality of treatment chambers is configured to hold the substrate in a vertical state during treatment.

A manufacturing apparatus of stacked films according to another embodiment of the present invention includes: a main transporting route having first and second transfer devices connected through a first transporting chamber; a first sub-transporting route extending in a direction intersecting the main transporting route, the first sub-transporting having a second transporting chamber connected to the first transfer device and a first delivery chamber connected to the second transporting chamber; a second sub-transporting route extending in a direction intersecting the main transporting route, the second sub-transporting route having a third transporting chamber connected to the second transfer device and a second delivery chamber connected to the third transporting chamber; a plurality of first treatment chambers connected to the first delivery chamber; and a plurality of second treatment chambers connected to the second transporting chamber. The main transporting route is configured to transfer a substrate to be treated in a horizontal state. One of the plurality of first treatment chambers is configured to hold the substrate in a vertical state during treatment. One of the plurality of second treatment chambers is configured to hold the substrate in a horizontal state.

A manufacturing method of stacked layers according to an embodiment of the present invention is a manufacturing method of stacked layers with a manufacturing apparatus. The manufacturing apparatus includes: a main transporting route having first and second transfer devices connected through a first transporting chamber; a sub-transporting route extending in a direction intersecting the main transporting route, the sub-transporting route having a second transporting chamber connected to the first or second transfer device and a delivery chamber connected to the second transfer chamber; and a plurality of first treatment chambers connected to the delivery chamber. The manufacturing method includes: preparing a substrate to be treated, the substrate having, over an insulating surface, a pixel electrode and a bank covering an edge portion of the pixel electrode and exposing a part of an upper surface of the pixel electrode; transporting the substrate to the first transfer device provided on the main transporting route of the manufacturing apparatus; transporting the substrate from the first transfer device to the delivery chamber through the second transporting chamber; transporting the substrate from the delivery chamber to one of the first treatment chambers; forming a first organic layer over the pixel electrode and the bank while maintaining the substrate in a horizontal state; returning the substrate from the one of the first treatment chambers to the delivery chamber; returning the substrate from the delivery chamber to another one of the first treatment chambers; forming a second organic layer over the first organic layer in a region overlapping with the pixel electrode while maintaining the substrate in a vertical state; returning the substrate from the another one of the plurality of first treatment chambers to the delivery chamber; and returning the substrate from the delivery chamber to the first transfer device through the second transporting chamber. The manufacturing method further includes a step of rotating the substrate from the horizontal state to the vertical state while the substrate is transported from the delivery chamber to the another one of the plurality of first treatment chambers.

A manufacturing method of stacked layers according to another embodiment of the present invention is a manufacturing method of stacked layers with a manufacturing apparatus. The manufacturing apparatus includes: a main transporting route having first and second transfer devices connected through a first transporting chamber; a first sub-transporting route extending in a direction intersecting the main transporting route, the first sub-transporting having a second transporting chamber connected to the first transfer device and a first delivery chamber connected to the second transporting chamber; a second sub-transporting route extending in a direction intersecting the main transporting route, the second sub-transporting route having a third transporting chamber connected to the second transfer device and a second delivery chamber connected to the third transporting chamber; a plurality of first treatment chambers connected to the first delivery chamber; and a plurality of second treatment chambers connected to the second transporting chamber. The manufacturing method includes: preparing a substrate to be treated, the substrate having, over an insulating surface, a pixel electrode and a bank covering an edge portion of the pixel electrode and exposing a part of an upper surface of the pixel electrode; transporting the substrate to the first transfer device provided on the main transporting route of the manufacturing apparatus; transporting the substrate from the first transfer device to the first delivery chamber through the second transporting chamber; transporting the substrate from the first delivery chamber to one of the first treatment chambers; forming a first organic layer over the pixel electrode and the bank while maintaining the substrate in a horizontal state; returning the substrate from the one of the first treatment chambers to the first delivery chamber; returning the substrate from the first delivery chamber to the first transfer device through the second transporting chamber; transporting the substrate from the first transfer device to the second transfer device through the first transporting chamber; transporting the substrate from the second transfer device to the second delivery chamber through the third transporting chamber; transporting the substrate from the second delivery chamber to one of the second treatment chambers; forming a second organic layer over the first organic layer in a region overlapping with the pixel electrode while maintaining the substrate in a vertical state; returning the substrate from the one of the plurality of second treatment chambers to the second delivery chamber; and returning the substrate from the second delivery chamber to the second transfer device through the third transporting chamber. The manufacturing method further includes a step of rotating the substrate from the horizontal state to the vertical state while the substrate is transported from the second delivery chamber to the second transporting chamber or from the second delivery chamber to the one of the plurality of second treatment chambers.

BRIEF DESCRIPTION OF DRAWINGS

FIG. 4 is a drawing showing a structural example of a conventional manufacturing apparatus of a light-emitting element:

DESCRIPTION OF EMBODIMENTS

Hereinafter, the embodiments of the present invention are explained with reference to the drawings. The drawings may be illustrated so that the width, thickness, shape, and the like are illustrated more schematically compared with those of the actual modes in order to provide a clearer explanation. However, unless particularly specified, they are only an example and do not limit the interpretation of the invention. In addition, in the specification and the drawings, the same reference number is provided to an element that is the same as that which appears in preceding drawings, and a detailed explanation may be omitted as appropriate.

Furthermore, in the specification, unless specifically stated, when a state is expressed where a structure is arranged "over" another structure, such an expression includes both a case where the substrate is arranged immediately above the "other structure" so as to be in contact with the "other structure" and a case where the structure is arranged over the "other structure" with an additional structure therebetween.

Figure 1:
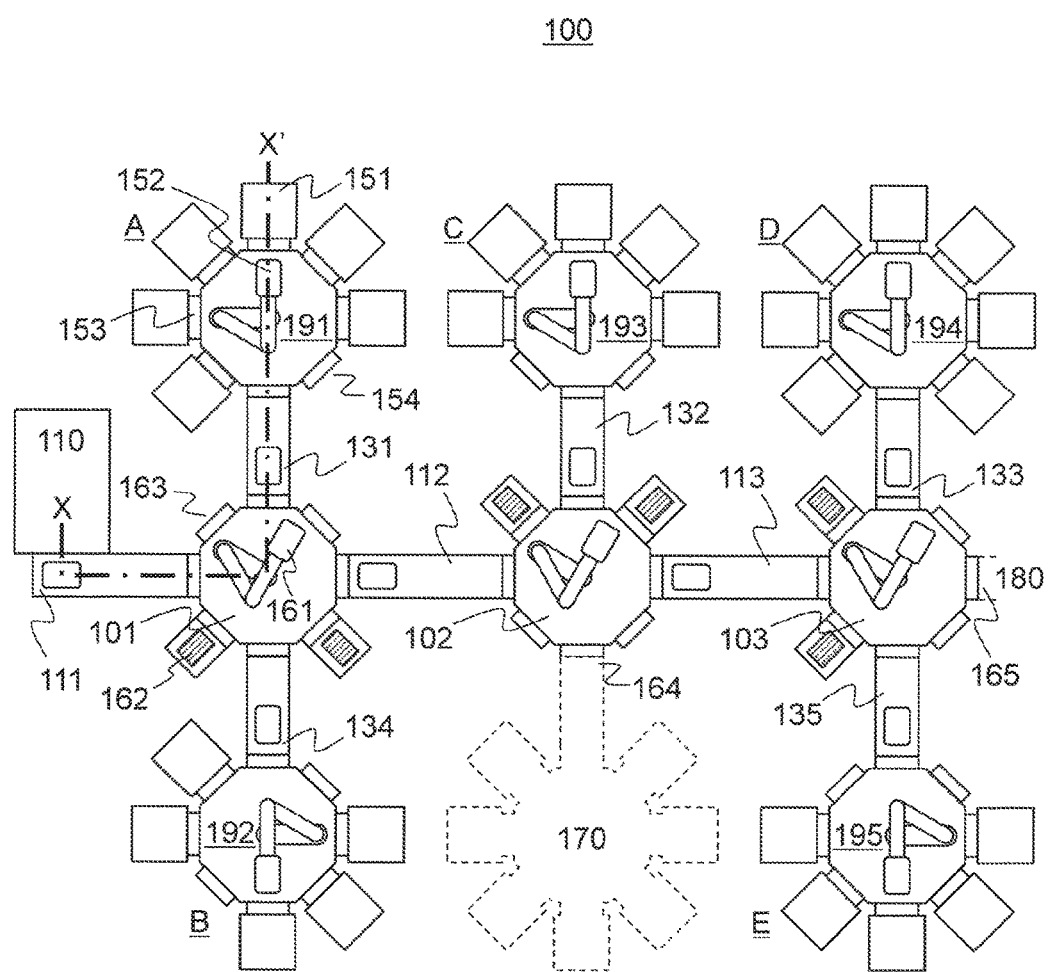
FIG. 1 is a drawing showing a manufacturing apparatus of a light-emitting element according to an embodiment of the present invention.

FIG. 1 shows a structural example of a manufacturing apparatus 100 of a light-emitting element according to an embodiment of the present invention. In FIG. 1, a section structured by transfer devices 101 to 103 and conveyors (transporting chambers) 111 to 113 is a main transporting route, and treatment devices A to E are connected, through conveyors 131 to 135, to the main transporting route in a branch form in a direction intersecting the main transporting route. Reference number 110 is an inlet/outlet for a substrate and is connected to a substrate stocker (not shown), for example. The conveyors 111 to 113 and 131 to 135 undergo transportation of a substrate to be treated between the adjacent transfer devices or between the transfer device and delivery chambers 191 to 195 of the treatment devices A to E. In FIG. 1, the main transporting route has a linear shape. However, the main transporting route is not limited to this shape, and the transfer devices 101 to 103 and the conveyors 111 to 113 constructing the main transporting route may be connected in a unicursal line shape in this example.

The transfer device 101 has a plurality of ports, and the conveyors 111, 112, 131, and 134 are connected thereto through the ports. The transfer device 101 possesses a transfer arm 161 and transfers a substrate to be treated to/from the conveyors 111, 112, 131, and 134. One or a plurality of buffers 162 may be connected to the transfer device 101. The buffers 162 are used in order to temporally retract a substrate to be treated in a waiting state for being input to the apparatus. When the treatment chambers A to E are different in treatment ability, it is possible to prevent the substrates from being piled up on the main transporting route without interference between the substrates arranged in the transport sequence. In FIG. 1, two buffers 162 are connected to the transfer device 101. However, it is sufficient that only a necessary number of the buffers 162 are connected to each transfer device, and the transfer device may possess a vacant port 163.

The treatment device A is structured by the delivery chamber 191 having a transfer arm 152 to which a plurality of chambers (treatment chambers) 152 in which each treatment is conducted is connected. Each chamber 151 is connected to the delivery chamber 191 through a port. Each port possesses a load lock gate 153. The load lock gate 153 is airtight so as to place each section of the apparatus under a vacuum environment or a specific atmosphere depending on necessity and possesses a mechanism to insulate a space continuing inside the load lock gate 153 from a space outside the load lock gate 153. In FIG. 1, the delivery chamber 191 has 8 ports, and one of the ports is occupied for connection to the conveyor 131. Thus, a maximum of 7 chambers 151 can be connected thereto. It is sufficient that only a necessary number of the chambers 151 for each process are connected, and the delivery chamber 191 may possess a vacant port 154. The same is applied to other treatment devices B to E.

The conveyors 111 to 113 and 131 to 135 of FIG. 1 have a conveyor structure where a substrate is transported therein. However, in the case where a distance between the transfer devices or between the transfer device and the treatment device is not relatively long and a substrate to be treated can be transferred within an operation range of the transfer arm 161, the conveyors may simply have a structure in which a stage over which a substrate to be treated is disposed is provided.

In the manufacturing apparatus of a light-emitting element of the present invention, a region in which the transfer devices 101 to 103, the conveyors 111 to 113 provided on the main transporting route, and the conveyors 131 to 135 arranged in a branch shape are connected is kept in a vacuum state. Therefore, when a substrate to be treated is shuttled between the plurality of treatment devices, the substrate is not exposed to air during processing.

Figure 2:
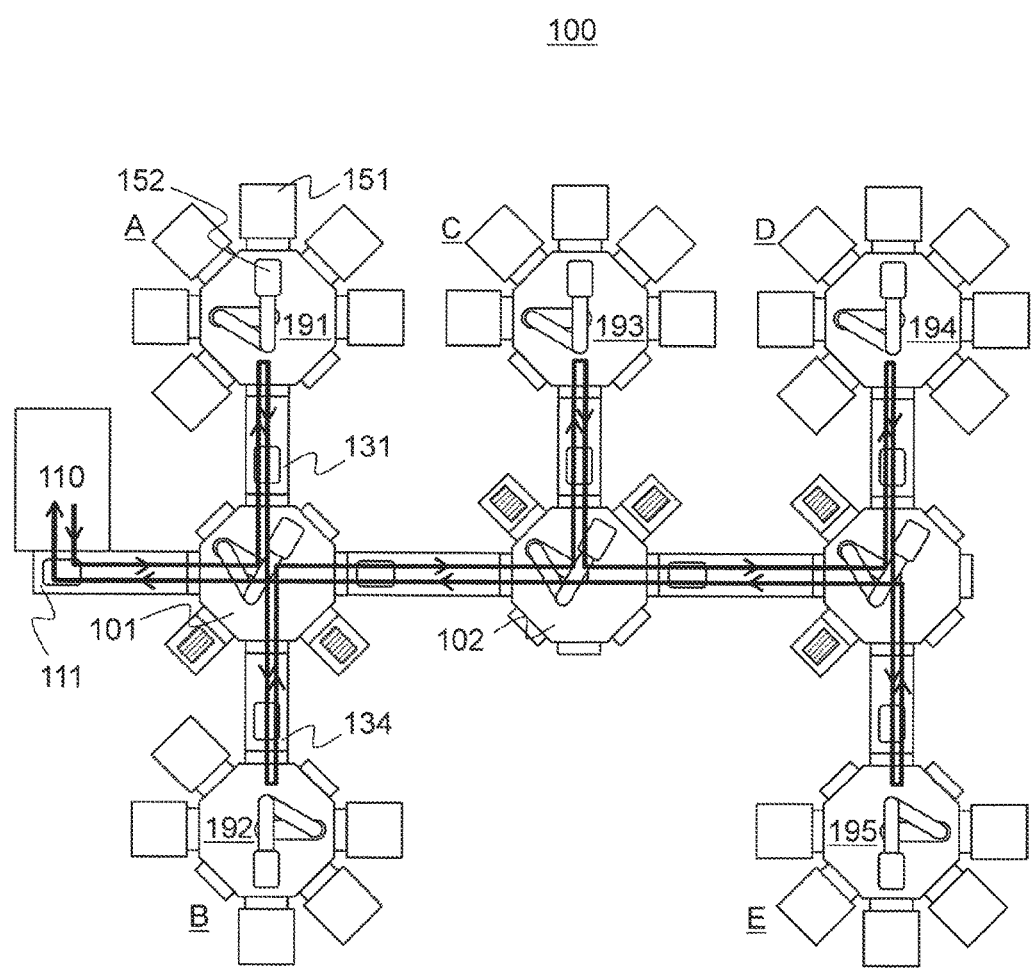
FIG. 2 is a drawing showing a manufacturing apparatus of a light-emitting element according to an embodiment of the present invention.

FIG. 2 shows an example of a treatment process. The arrows roughly indicate a route of a substrate to be treated. A substrate to be treated is transported to the transfer device 101 from the inlet/outlet 110 through the conveyor 111. The transfer device 101 inputs, via the conveyor 131, the substrate to be treated to the delivery chamber 191 of the treatment device A in which a first treatment is performed. In the treatment device A, respective treatments are carried out while transferring the substrate to be treated between the delivery chamber 191 and treatment chambers 151. After all of the process steps are completed in the treatment device A, the transfer device 101 receives the substrate to be treated from the conveyor 131 and transports the substrate to the conveyor 134.

After that, the process is sequentially carried out in the treatment devices B, C, D, and then E, and the substrate to be treated is brought back again to the inlet/outlet 110 after all steps in the treatment chambers are completed.

A main characteristic of the manufacturing apparatus of a light-emitting element of the present invention is that each of the treatment devices A to E is connected to the main transporting route in a branch form through the conveyors 131 to 135. For example, as shown in FIG. 2, it is possible not only to sequentially execute a process according to the order of the treatment devices A, B, C, D, and then E but also adapt the manufacturing apparatus to a variation of the order of the treatment devices to A, E, C, D, and then B due to a change of the stacked-layer structure even though the connection of each treatment device is not changed.

Additionally, process steps conducted in the chambers connected to each of the treatment devices may not be always carried out sequentially, and a treatment in the same chamber may be conducted a plurality of times in different process steps. In such a case, a substrate to be treated is also readily shuttled on the main transporting route.

Even if the order of the treatment devices employed becomes complicated, the buffer 162 permits the substrates to be readily retracted and pass each other. The same can be applied in the case where a plurality of substrates to be treated is input to the manufacturing apparatus 100.

The vacant port 164 of the transfer device 102 and the vacant port 165 of the transfer device 103 provide future extensibility. For example, it is possible to additionally connect a treatment device 170 (see FIG. 1) and increase a process number by further connecting a conveyor.

The manufacturing apparatus 100 of a light-emitting element of the present invention has flexibility to such expansion. For example, a treatment conducted in a treatment device 170 additionally connected to the vacant port 164 may be a treatment which is carried out during another treatment conducted in another treatment device. For example, when a new treatment device F is additionally required to reconstruct a process performed in the order of the treatment devices A, B, C, D, and then E into a process performed in the order of the treatment devices A, F, B, C, D, and then E, such a reconstruction can be readily achieved by adding the treatment device F by using the vacant port 164. It is not necessary to move the existing equipment including other treatment devices A to E, the transfer devices 101 to 103, and the like.

All of the process steps conducted in the treatment devices do not always take the same treatment time, and it is not rare that a certain step requires a longer treatment time than the other steps. Thus, the treatment device which requires a long treatment time acts as a bottleneck, decreasing throughput of the whole of the manufacturing apparatus of a light-emitting element. In such a case, a treatment chamber used for the process requiring a long treatment time may be added and arranged in parallel by utilizing the vacant port 164. A plurality of substrates to be treated is divided for a parallel treatment, and the buffers 162 of each section are utilized, by which a process conducted in one treatment device and a process conducted in a plurality of treatment devices in parallel can be appropriately combined.

For example, fabrication of an organic EL element requires formation of each of a plurality of organic layers at a high purity in an individual step, and the film-formation is carried out under a vacuum, at a reduced pressure, or under a specific atmosphere. Hence, a large number of treatment chambers is necessary. Therefore, a scale of a manufacturing apparatus may become large, and a layout of a manufacturing apparatus may be difficult in view of a shape of a clean room and floorage. In the manufacturing apparatus 100 of a light-emitting element of the present invention, a degree of freedom in arrangement of the treatment devices connected in a branch shape can be increased by arranging the plurality of transfer devices on the main transporting route, thereby appropriately solving the aforementioned problem.

Additionally, when a device layout is strictly limited, a distance between the transfer devices, between the treatment devices, or between the transfer device and the treatment device may be increased by elongating a part of the conveyors. For example, as demonstrated by the manufacturing apparatus 600 shown in FIG. 6, when the treatment devices A and C respectively possess treatment chambers 601 and 602 for single-wafer processing, and the treatment chambers B and D respectively have treatment chambers 603 and 604 for two-wafer processing, an arrangement of the manufacturing apparatus may be inadequate because the floorage of the treatment chambers 603 and 604 is obviously large. In such a case, the degree of freedom in arrangement of the treatment devices B and D can be increased by making the conveyors 620 longer than the conveyor 610.

Figure 6:
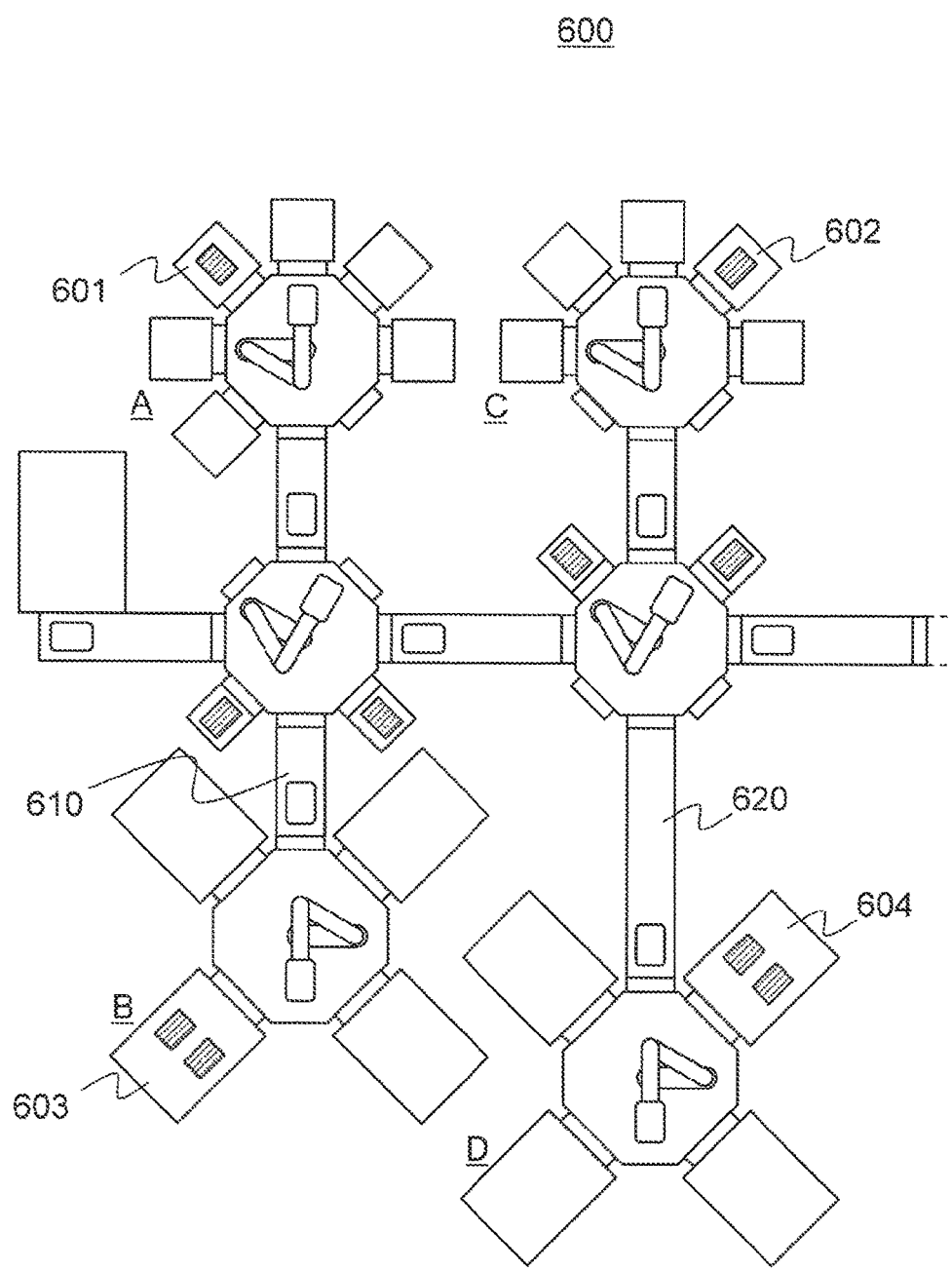
FIG. 6 is a drawing showing a manufacturing apparatus of a light-emitting element according to an embodiment of the present invention.

FIG. 6 is illustrated so that the treatment chambers 601 and 602 of the treatment devices A and C are each a chamber for single-wafer processing, while the treatment chambers 603 and 604 of the treatment devices B and D are each a chamber for two-wafer processing. However, the manufacturing apparatus is not limited thereto, and a treatment chamber for single-wafer processing and a treatment chamber for two-wafer processing may be combined in one treatment device.

Figure 3:
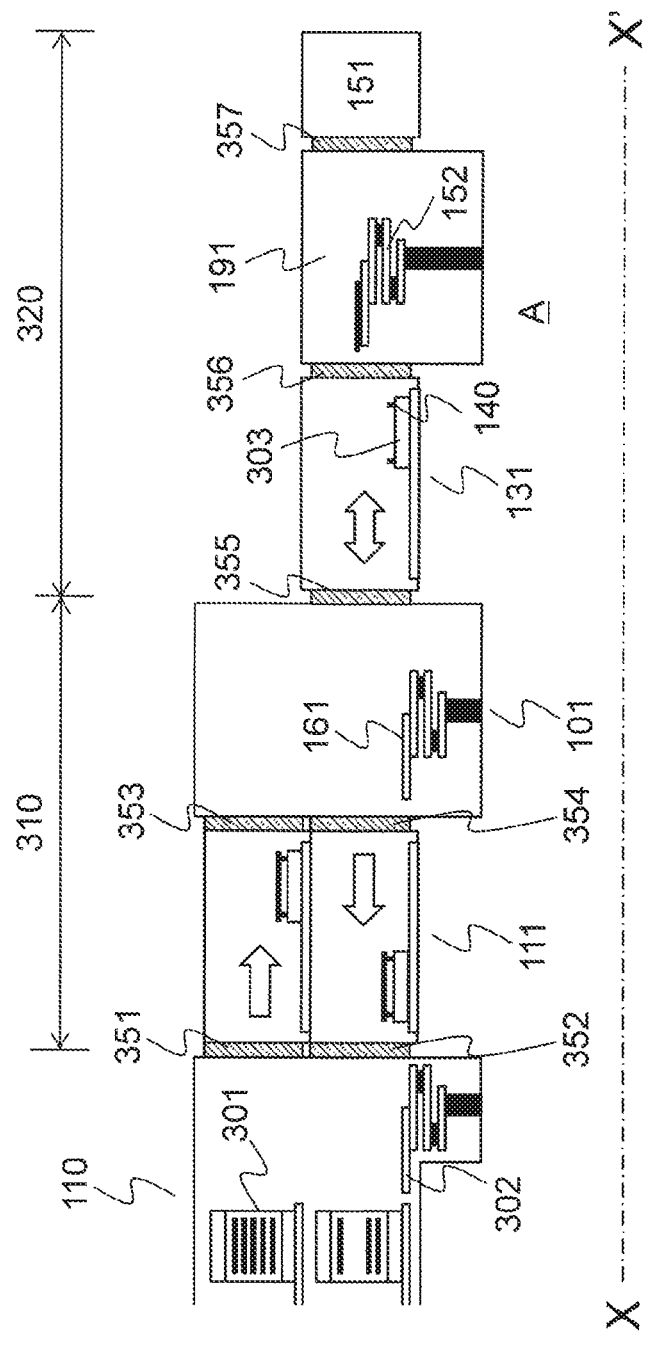
FIG. 3 is a drawing showing a manufacturing apparatus of a light-emitting element according to an embodiment of the present invention.

A X-X' cross section of FIG. 1 is shown in FIG. 3. Elements already explained in FIG. 1 are provided with the same reference numbers. In FIG. 3, a section shown by 310, that is, the conveyor 111 and the transfer device 101 correspond to the main transporting route, and a section shown by 320, that is, the conveyor 131 and the treatment device A are arranged in a branch shape from the main transporting route.

A substrate cassette 301 which stores substrates before being input to the manufacturing apparatus is provided to the inlet/outlet 110. A transfer arm 302 picks out a substrate to be treated from the substrate cassette 301 and transfers it to the conveyor 111. In FIG. 3, the conveyor 111 is illustrated so as to have a two-layer structure. This structure is used in order to increase efficiency in the case where the substrates to be treated shuttle on the main transporting route in the same period. As shown in FIG. 3, the conveyor 111 may be a one-way transport type in which an upper-layer conveyor and a lower-layer conveyor are respectively used for a forward direction and a reverse direction or a dual-direction transport type in which each of the conveyors can freely move in the forward and reverse directions. This structure allows the plurality of substrates to be treated pass each other on the main transporting route. Moreover, the conveyor 111 has two vertically stacked layers in FIG. 3. However, the conveyor 111 is not limited thereto, and the two layers may be arranged in a horizontal direction or a diagonal direction.

The transfer device 101 has the transfer arm 161 and transfers a substrate to be treated between the conveyor 111 and the conveyor 112 (not illustrated in FIG. 3) on the main transporting route or between the conveyor 111 on the main transporting route and the conveyor 132 linked to the delivery chamber 191 of the treatment chamber A. The conveyor 131 transfers a substrate to be treated to the delivery chamber 191 of the treatment device A. It is not necessary that a plurality of substrates to be treated be shuttled in the same period in this path. Hence, unlike the conveyor 111 belonging to the main transporting route, the conveyor 131 may be a dual-direction transport type having a single-layer structure. Of course, the conveyor 131 may also be a two-layer structure. When the main transporting route and the treatment device A can be brought sufficiently close to each other, the conveyor 131 may be simply a stage for disposing a substrate to be treated.

The treatment apparatus A takes a substrate to be treated with the transfer arm 152 provided to the delivery chamber 191 from the conveyor 131 and inputs the substrate to the chamber 151. Generally, a plurality of chambers is connected to the delivery chamber 191, and the treatment is conducted while a substrate to be treated is shuttled between the delivery chamber 191 and each chamber. After the treatment in the treatment chamber A is completed, a substrate to be treated is returned along the conveyor 131 and transported to the main transporting route.

The inlet/outlet 110, the conveyor 111, the transfer device 101, the conveyor 131, and the delivery chamber 191 are connected through ports. The chamber 151 is connected to the delivery chamber 191 through a port. The ports each have respective load lock gates 351 to 357. Since some of the steps implemented in the manufacturing apparatus 100 of a light-emitting element require a vacuum, a reduced pressure, or a specific atmosphere, each load lock gate possesses sufficient airtightness. In the treatment device, each chamber is able to possess a different atmosphere, and a region of minimum necessity is opened while transferring a substrate, thereby efficiently conducing substitution of an atmosphere and reduction of pressure.

The conveyors 111 and 131 each have a moving stage 303 supporting a substrate to be treated. In a manufacturing apparatus for a display device, a substrate is adsorbed with a vacuum chuck to avoid dislocation or a fall of the substrate from the stage 303 during movement. However, in an evaporation apparatus or the like of an organic EL element, a transporting path is kept under a vacuum to prevent exposure to air and adsorption with a vacuum chuck is difficult. As a countermeasure to prevent the dislocation and the fall of a substrate to be treated, a method is considered, for example, whereby pins 140 to maintain a substrate to be treated on the stage 303 are provided so that the pins 140 contact with a vicinity of a peripheral portion of the substrate but do not contact with a central portion of the substrate, allowing the substrate to be transported in a state where a center of the substrate is bent due to gravity. The central portion of the substrate is located at a lower position than the tips of the pins 140 due to the bending, thereby preventing dislocation of the substrate in a lateral direction.

Alternatively, although not specifically illustrated, pegs for holding a substrate to be treated may be provided to the stage 303 to clamp an edge portion of the substrate, especially positions which do not influence the film formation.

Next, a manufacturing process of an organic EL element is explained by using FIG. 5A to FIG. 5F. FIG. 5A to FIG. 5F show a cross-sectional view of a display region of a display device 500. Pixel electrodes 502 and 503 are formed over an insulating surface 501. Here, a transistor for controlling each pixel, wirings for supplying a power source to the light-emitting element, and the like are fabricated in a layer under the insulating surface. A bank 504 is formed so as to cover edge portions of the pixel electrodes 502 and 503. Regions of the pixel electrodes 502 and 503 which are exposed from the bank 504 serves as an emission region formed later. The processes up to the formation of the pixel electrodes 502 and 503 and the bank 504 are conducted by photolithography and etching. A substrate in a state shown in FIG. 5A corresponds to the aforementioned substrate to be treated.

Figure 5A:
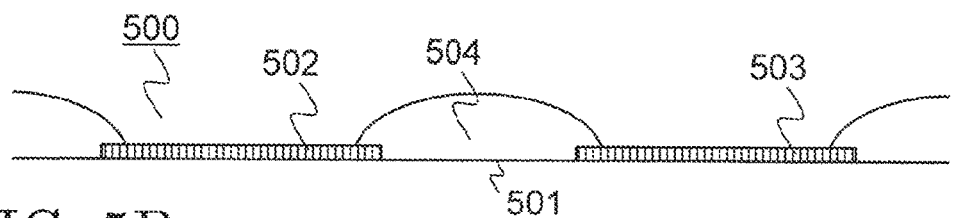
FIG. 5A to FIG. 5F are drawings showing a fabrication process of an organic EL element.

Here, a structure is explained where the pixel electrodes 502 and 503 serve as an anode of an organic EL element. When the pixel electrodes 502 and 503 serve as an anode, it is preferred to use a material with a high work function. In FIG. 5A, a structure in which emitted light is extracted on a lower side is called a bottom-emission mode. In this case, the pixel electrodes 502 and 503 are preferably prepared with a transparent conductive material such as ITO, IZO, and ZnO. These materials are preferred because transparency of the pixel electrodes allows light extraction and the work function is high. On the other hand, in the case of a top-emission mode where the emitted light is extracted on an upper side, a structure is represented in which Ag and the like is used, and the work function of a surface is increased by forming a thin layer of ITO on the upmost surface because reflectivity is required for the pixel electrodes 502 and 503.

Figure 5B:
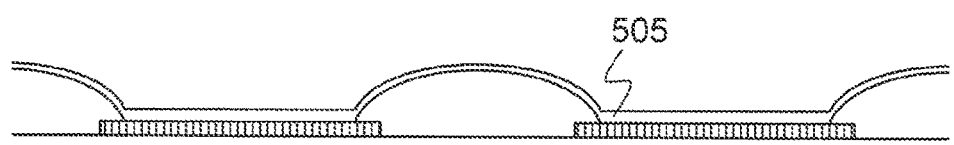

As shown in FIG. 5B, a hole-transporting layer 505 is first formed over the substrate to be treated. As a hole-transporting material, a triarylamine derivative, a bisstyrylamine derivative, or the like is preferred, and α-NPD, TPD, TPAC, Spiro-TPD, PDA, m-MTDATA, and the like are represented as a typical compound. A hole-injection layer may be provided between the pixel electrodes 502 and 503 and the hole-transporting layer 505 depending on the work function of the surfaces of the pixel electrodes 502 and 503. Furthermore, although the hole-transporting layer 505 is provided as a continuous layer covering the pixel electrodes 502 and 503 and the bank 504, it may be formed individually for the pixel electrodes 502 and 503.

Figure 5C:
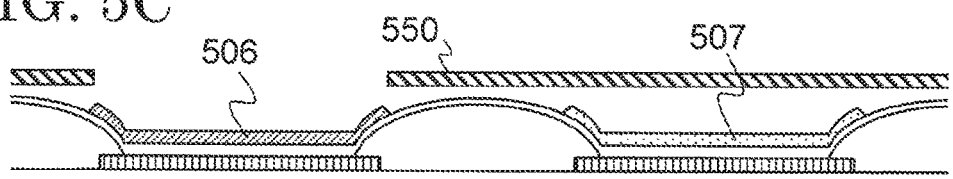

Next, as shown in FIG. 5C, emission layers 506 and 506 are formed over the hole-transporting layer 505. In FIG. 5C, the emission layer 506 is formed in a region overlapping with the pixel electrode 502, whereas the light-emitting layer 507 is formed in a region overlapping with the pixel electrode 503. This is because emission layers including different materials are individually prepared in view of the emission color of each pixel. In FIG. 5C, a mask 550 having an opening in the region overlapping with the pixel electrode 502 is arranged parallel to the substrate to form the emission layer 506, by which the emission layer 506 is not formed in the region overlapping with the pixel electrode 503. When the emission layer 507 is formed over the pixel electrode 503, a mask 550 having an opening in a different position is used, and the emission layer 507 is formed only in the region overlapping with the pixel electrode 503. As shown in FIG. 5C, in the case where the emission layers are prepared individually according to the emission color, masks with the number equal to the number of the emission colors are used, and the aforementioned process is repeated. As an alternative method, similar to the formation of the hole-transporting layer 505 and the like, an emission layer continuously extending from over the pixel electrode 502 to over the pixel electrode 503 may be formed by using a material from which white emission is obtained. In this case, the emission color is controlled with a color filter or a color-conversion layer additionally fabricated.

As a material for the emission layers 506 and 507, a metal complex such as an aluminum complex and a beryllium complex is typically represented. Moreover, the emission layers 506 and 507 may be fabricated by using the aforementioned materials as a host material and co-evaporating a slight amount of a dopant. As a dopant material in such a case, an iridium complex, perylene, rubrene, coumarin, and the like are representative. The aforementioned materials are respectively selected depending on the emission color desired for the emission layers 506 and 507.

Figure 5D:
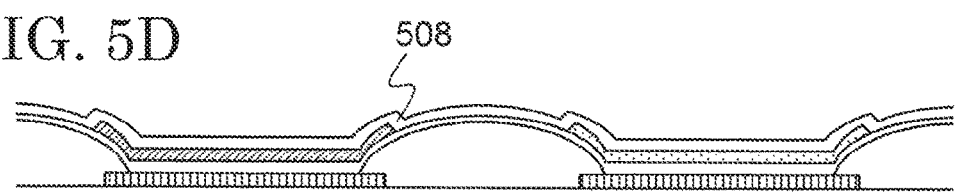

Next, as shown in FIG. 5D, an electron-transporting layer 508 is formed over the hole-transporting layer 505 and the emission layers 506 and 507. As an electron-transporting material, a triazole derivative, an oxadiazole derivative, or the like is preferred, and BND, PBD, TAZ, OXD, and the like are represented as a representative compound. In FIG. 5D, the electron-transporting layer 508 is formed as a continuous layer covering the hole-transporting layer 505 and the emission layers 506 and 507. However, the electron-transporting layer 508 may be formed individually over each of the pixel electrodes 502 and 503.

Figure 5E:
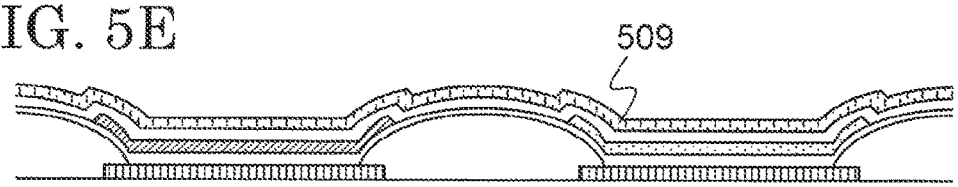

Next, as shown in FIG. 5E, an opposing electrode 509 is formed over the electron-transporting layer 508. The opposing electrode 509 serves as a cathode of the organic EL element, and a material with a low work function is typically used. MgAg, Al, or the like is typically used. Since these materials are a metal material, they are usually formed as a reflective electrode. In the case of a bottom-emission mode, the opposing electrode 509 may be used as a reflective electrode. However, in the case of a top-emission mode, the aforementioned metal material is processed to a thin film with a thickness of approximately 10 nm to several tens of nanometers so as to have a transmitting property to some extent because the opposing electrode 509 is required to transmit the emitted light. The opposing electrode 509 may be prepared with a transparent conductive material such as ITO, IZO, and ZnO. Note that an electron-injection layer may be provided between the electron-transporting layer 508 and the opposing electrode 509 because a work function of these transparent conductive materials, Al, and the like is relatively high.

Through these processes, the fabrication of an organic EL element is completed. Since an organic EL element is readily degraded by moisture in air, it is preferred to avoid exposure to air in each film-forming step and during transportation of a substrate to be treated between the film-forming steps. Therefore, it is preferred to configure the manufacturing apparatus 100 so that the inside thereof is kept under vacuum or an atmosphere of a specific gas and that a substrate to be treated is transported therein.

Figure 5F:
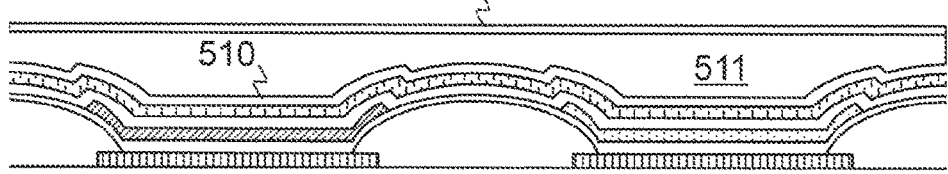

Additionally, since the degradation promoted by moisture in air may proceed after fabrication of an organic EL element is completed, a sealing film may be formed as shown in FIG. 5F with a purpose of preventing exposure of an organic EL element to air. Here, the sealing film is prepared as a three-layer structure of a silicon nitride film 510, an organic resin film 511, and a silicon nitride film 512. Since the formation of the silicon nitride film 510 as the lowest layer of the sealing film provides a high dampproofing property, the following formation of the organic resin film 511 and the like may be performed under air. This sealing film is also useful from a viewpoint of preventing attachment of foreign objects to an organic EL element or damage to the stacked film by sharp foreign objects.

When the emission layer explained by using FIG. 5C is prepared, each emission layer is formed at a desired position by placing the mask 550 on a surface where the emission layer is fabricated. However, an increase in size of a substrate to be treated accompanies an increase in size of the mask, and an increase in resolution of a display device accompanies an aperture ratio of the mask, which results in a reduction of the strength of the mask. As a result, the substrate to be treated and the mask are bent due to gravity, which leads to variation of a distance therebetween and dislocation due to the bending. In order to avoid this problem, the formation of the emission layer may be performed while maintaining the substrate to be treated and the mask 500 in a vertical state by rotating them by 90°. In this case, a mechanism for rotating the substrate to be treated is provided between the main transporting route and the chambers 151.

Figure 9A:
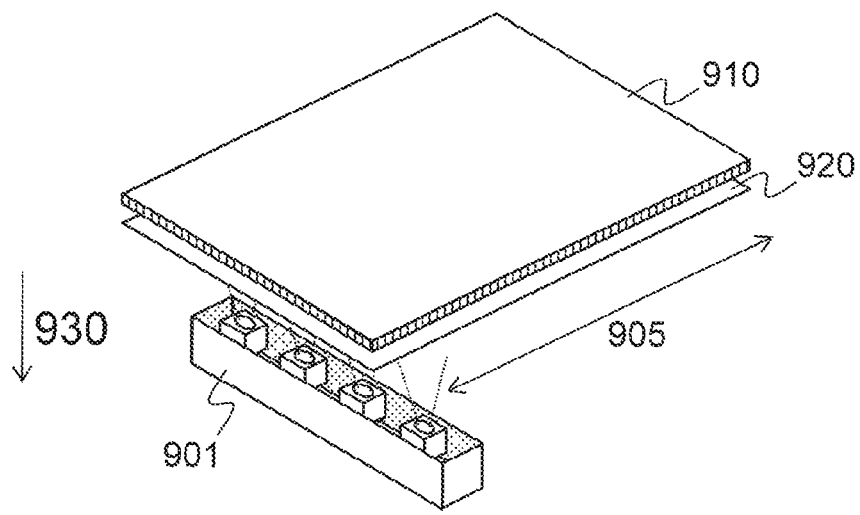
FIG. 9A and FIG. 9B are drawings showing an evaporation mode of an organic layer of a light-emitting element.
Figure 9B:
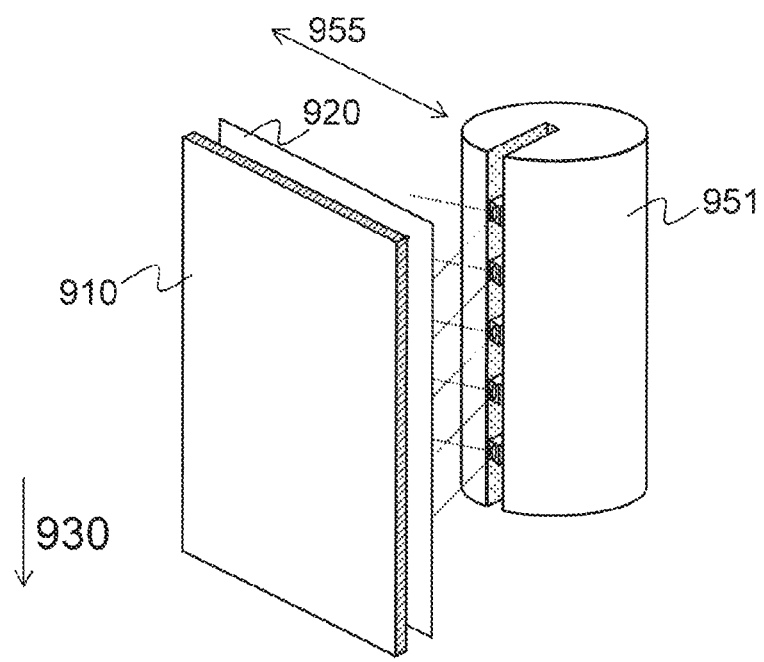

FIG. 9A and FIG. 9B shows schematic views of the step for forming the emission layer over a substrate to be treated. FIG. 9A shows an example of the formation of the emission layer when a substrate 910 to be treated and the mask 920 are maintained horizontally so that a surface thereof faces a direction parallel to gravity 930. Specifically, a mode is illustrated where an organic material is evaporated from an evaporation source 901 provided under the substrate 910 and the emission layer is formed on a side, that is, a lower face, of the substrate 910 facing the evaporation source 901. In FIG. 9A, a structure is shown in which the evaporation source 901 is a so-called linear source type structured by a plurality of evaporation sources arranged in a line and the evaporation source moves in a direction of an arrow 905. However, the evaporation source is not limited to this structure. In FIG. 5C, a mode is schematically illustrated where the emission layer 506 is formed over an upper surface of the substrate 910. However, the evaporation source 901, the substrate 910, and the mask are actually arranged according to the positional relationship shown in FIG. 9A due to the evaporation direction of the organic material from the evaporation source 901. In this case, gravity 930 acts parallel to a thickness direction of the substrate 910 and the mask 920, which readily leads to their bending. In the case where the substrate 910 and the mask 920 are bent by the gravity 930, the mask 920 may contact with the surface of the substrate 910, and a plurality of organic layers formed on the substrate 910 may be readily damaged. In order to prevent such a defect, convex spacers can be formed on the bank 504 shown in FIG. 5A, which prevents the mask 920 from contacting with the plurality of organic layers on the substrate 910 even if the mask 920 bends.

FIG. 9B is an example of the formation of the emission layer in which the substrate 910 to be treated is held vertically so that its surface faces a direction perpendicular to gravity. Specifically, a mode is demonstrated where the evaporation source 951 which is provided so that the organic material is evaporated in a lateral direction, and the emission layer 911 is formed on a side of the substrate 910 opposing the evaporation source. In FIG. 9B, a structure is illustrated in which the evaporation source 951 is a so-called linear source type structured with a plurality of evaporation sources arranged in a line and the evaporation source 951 moves in a direction of an arrow 955. However, the evaporation source is not limited to this structure. In this case, since gravity 930 acts perpendicularly to the thickness direction of the substrate 910 and the mask 920, their bending hardly occurs. Since the contact of the mask 920 with the surface of the substrate 910 is negligible, it is not necessary to form the convex spacers on the bank 504 as mentioned above.

FIG. 8A to FIG. 8E correspond to the cross-sectional view of the manufacturing apparatus shown in FIG. 3 and shows an example of a mode of the sub-transporting route 320 different in that a mechanism for rotating a substrate to be treated is provided.

In the mode of the manufacturing apparatus shown in FIG. 3, a substrate to be treated is transported and treated in a horizontal state, while the treatment in the chambers 151 in the mode of the manufacturing apparatus shown in FIG. 8A to FIG. 8E is conducted by maintaining a substrate in a vertical state.

Figure 8A:
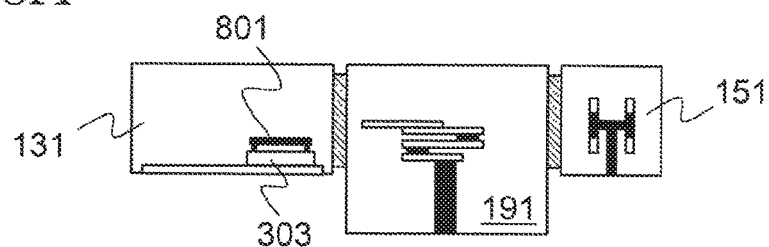
FIG. 8A to FIG. 8E are drawings of a manufacturing apparatus of a light-emitting element according to an embodiment of the present invention.
Figure 8B:
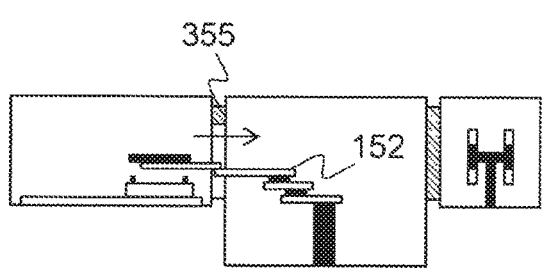
Figure 8C:
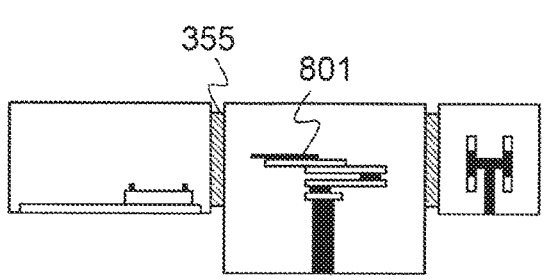

FIG. 8A shows a state in which a substrate 801 to be treated is disposed over the stage 303 in the conveyor 131 in the sub-transporting route. From this state, the load lock gate 355 is opened, and the transfer arm receives the substrate 801 disposed over the state 303 and drags the substrate to a side of the transporting chamber 191 of the manufacturing apparatus. After that, the load lock gate 355 is closed, by which the delivery chamber 191 and the sub-transporting route are spatially separated from each other (FIG. 8C).

Figure 8D:
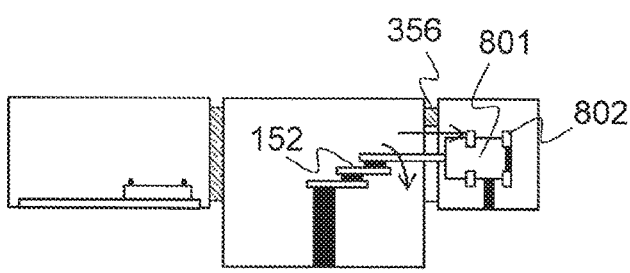

Next, as shown in FIG. 8D, the road lock gate 356 linking to the chamber 151 is opened, and the transfer arm 152 transfers the substrate 801 to be treated to a side of the chamber 151. The substrate to be treated is processed in the chamber 151 while maintaining the substrate in a vertical state. The transfer arm 152 possesses a rotation axis in the middle of the arm. The arm rotates while transferring the substrate to the chamber 151, by which the substrate is rotated from the horizontal state to the vertical state. A stage 802 has pegs for clamping an edge portion of the substrate and receives and holds the substrate 801 rotated by the transfer arm 152.

Figure 8E:
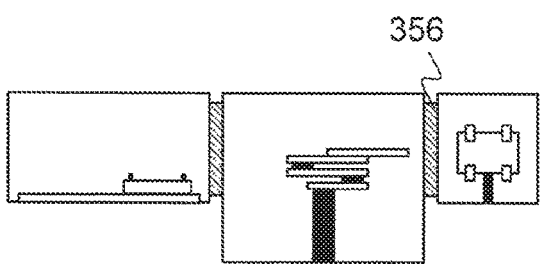

After that, as shown in FIG. 8E, the load lock gate 356 is closed, the chamber 151 is spatially separated, and the treatment is performed.

In FIG. 8A to FIG. 8E, the transfer arm 152 installed in the delivery chamber 191 has a rotation axis. However, the present embodiment is not limited thereto, and a transfer arm (not illustrated in FIG. 8A to FIG. 8E) provided on a side of the main transporting route may have a rotation axis. In this case, the stage 303 of the conveyor 131 provided on a side of the sub-transporting route has a mechanism for holding a substrate to be treated in a vertical state.

An advantage of providing the rotation axis to the transfer arm 152 of the delivery chamber 191 is that the holding style of a substrate to be treated can be freely selected in each of the plurality of chambers connected to the delivery chamber 191. For example, a substrate to be treated can be processed in a horizontal state in a chamber connected to the delivery chamber 191, whereas the substrate to be treated can be processed in a vertical state in another chamber connected to the delivery chamber.

FIG. 4 shows a conventional manufacturing apparatus of a light-emitting element in which treatment devices A to E are connected in series between an inlet 401 for a substrate and an outlet 402 for a substrate through transfer devices 421 to 424 and conveyors 411 and 412. A substrate to be treated input from the inlet 401 passes through the treating devices A, B, C, D, and E in this order.

In such a structure, in the case where the treatment order is changed, for example, in the case where a treatment is conducted in the treatment device D instead of the treatment device B immediately after a treatment in the treatment device A, the substrate must pass through the treatment devices B and C interposed therebetween. That is, since the treatment device is arranged on a flow line of the substrate, treatments of a substrate in the treatment devices B and C cannot be conducted after a treatment in the treatment device A is completed and until a treatment in the treatment device D is started. Moreover, an attempt to add a new treatment device F between the treatment devices A and B requires movement of at least the treatment device A, the conveyor 411, and the inlet 401. Hence, in the conventional manufacturing apparatus of a light-emitting element shown in FIG. 4, variation of the apparatus structure due to a change or addition of a process cannot be readily conducted. Additionally, as described above, when a specific treatment device in the middle part works as a bottleneck, it is difficult in the conventional structure to apply a method whereby this section is made parallel to increase throughput of the whole process.

In addition, the inlet 401 and the outlet 402 of the manufacturing apparatus of a light-emitting element shown in FIG. 4 are separated because the devices are connected in series. On the other hand, in the manufacturing apparatus of a light-emitting element of the present invention shown in FIG. 1, input and output of a substrate to be treated are accomplished with the inlet/outlet 110, which provides an advantage that the substrate to be treated can be readily transferred to/from the other devices and the stocker. Such a structure in which an inlet and an outlet are commonly provided is called an inter-back mode. The inter-back mode is applied not only to the inlet/outlet 110 but also to the treatment devices A to E because the input and output from/to the respective devices are achieved by the conveyors 131 to 135 in the manufacturing apparatus 100. Furthermore, the employment of the inter-back mode in each treatment device allows the treatment devices to be arranged in a branch shape with respect to the main transporting route, by which layout of the devices and connection between the devices are facilitated and provided with a high degree of freedom. Of course, since the inlet and outlet for a substrate may be preferably separated depending on an environment where the treatment devices are arranged, the structure may be appropriately selected.

Moreover, the main transporting route of FIG. 1, which is structured by the inlet/outlet 110 for a substrate, the transfer devices 101 to 103, and the conveyors 111 to 113, may have a cyclic structure by further connecting a head of a vacant port 180 of the transfer device 103, which is not on a side connected to the conveyor 113, to the inlet/outlet 110. In this case, the manufacturing apparatus is not strictly the inter-back mode but is almost the same as the inter-back mode because a substrate to be treated is transferred on and around the main transporting route, returned to the inlet/outlet 110, and then recovered.

Figure 7:
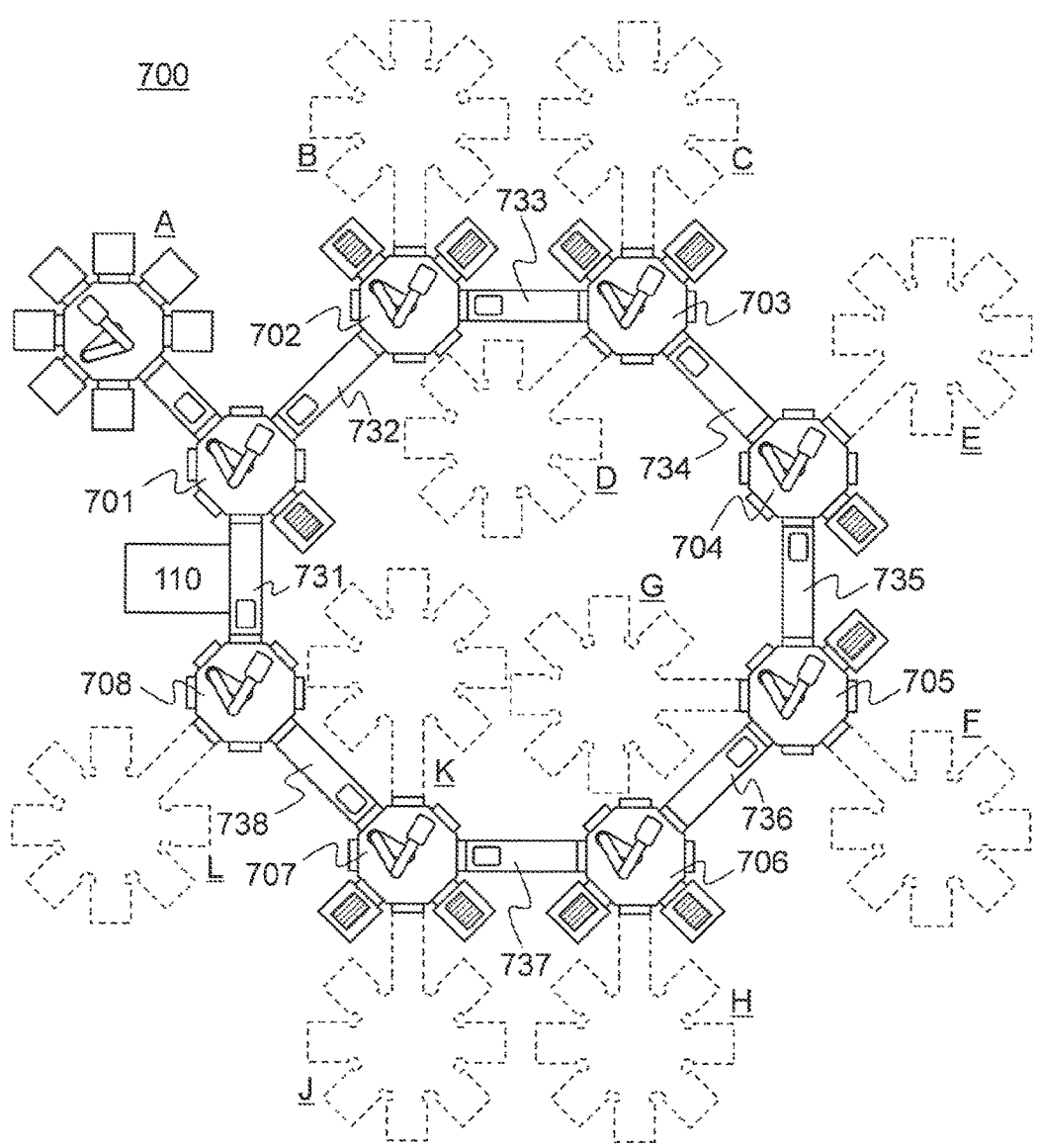
FIG. 7 is a drawing showing a manufacturing apparatus of a light-emitting element according to an embodiment of the present invention.

A specific example is shown in FIG. 7. In a manufacturing apparatus 700 of a light-emitting element, the inlet/outlet 110 for a substrate is connected to a conveyor 731, and a substrate to be treated is transferred between the inlet/outlet 110 and the conveyor 731. A cyclic path constructed by the transfer devices 701 to 708 and conveyors 731 to 738 is the main transporting route. The treatment device can be connected to each transfer device, via a sub-transporting route, through a port other than the ports connected to the conveyors forming the main transporting route. In FIG. 7, the treatment devices B to H and J to L indicated with dotted lines can be further connected in addition to the treatment device A indicated by solid lines. In the example of FIG. 7, one or two treatment devices are connected, via the sub-transporting route, to each of the transfer devices 701 to 708 on the main transporting route. However, three or more treatment devices may be connected as long as an arrangement space permits.

Additionally, focus placed on the number of the chambers connected to each treatment device reveals that a substrate-inlet face for receiving a substrate from the treatment device of the preceding process and a substrate-outlet face for transporting the substrate to the treating device of the following process are independently necessary for each treatment chamber according to the conventional structure shown in FIG. 4. On the other hand, in the structure of the present invention shown in FIG. 1, the substrate-inlet face can be the same as the substrate-outlet face because the treatment devices are arranged in a branch shape from the main transporting route. In other words, there is an advantage that the number of the chambers connectable to one treatment device is larger by one.

From the aforementioned viewpoint, superiority of the structure of the manufacturing apparatus of a light-emitting element of the present invention is extremely remarkable.

Technical characteristics of the manufacturing device and the manufacturing method of a light-emitting element of the present invention are listed below as a supplementary note.

A manufacturing apparatus of a light-emitting element according to an embodiment of the present invention includes: a main transporting route having first and second transfer devices connected through a first transporting chamber; a sub-transporting route extending in a direction intersecting the main transporting route, the sub-transporting route having a second transporting chamber connected to the first or second transfer device and a delivery chamber connected to the second transfer chamber; and a plurality of first treatment chambers connected to the delivery chamber. The main transporting route is configured to transfer a substrate to be treated in a horizontal state. One of the plurality of treatment chambers is configured to hold the substrate in a vertical state during treatment.

Another one of the plurality of first treatment chambers is configured to hold the substrate in a horizontal state.

A manufacturing apparatus of a light-emitting element according to an embodiment of the present invention includes: a main transporting route having first and second transfer devices connected through a first transporting chamber; a first sub-transporting route extending in a direction intersecting the main transporting route, the first sub-transporting having a second transporting chamber connected to the first transfer device and a first delivery chamber connected to the second transporting chamber; a second sub-transporting route extending in a direction intersecting the main transporting route, the second sub-transporting route having a third transporting chamber connected to the second transfer device and a second delivery chamber connected to the third transporting chamber; a plurality of first treatment chambers connected to the first delivery chamber; and a plurality of second treatment chambers connected to the second transporting chamber. The main transporting route is configured to transfer a substrate to be treated in a horizontal state. One of the plurality of first treatment chambers is configured to hold the substrate in a vertical state during treatment. One of the plurality of second treatment chambers is configured to hold the substrate in a horizontal state.

The first transfer device and the second transfer device each have a first port to which the first transporting chamber is connected, a second port to which the second transporting chamber is connected, and a third port to which a buffer for storing the substrate is connected. The first transporting chamber has a fourth port to which the second transporting chamber is connected and a fifth port to which one of the plurality of first treatment chambers is connected.

The first transfer device and the second transfer device each have a first port to which the first transporting chamber is connected, a second port to which the second transporting chamber is connected, and a third port to which a buffer for storing the substrate. The first delivery chamber and the second delivery chamber each have a fourth port to which the second transporting chamber is connected and a fifth port to which one of the plurality of first treatment chambers or one of the second treatment chambers is connected.

The first transfer device, the second transfer device, and one of the plurality of first treatment chambers each have an arm for transporting the substrate. The arm of the first transfer device, the second transfer device, or the one of the plurality of first treatment chambers has a rotation axis for rotating the substrate from a horizontal state to a vertical state or reversely.

The first transfer device, the second transfer device, one of the plurality of first treatment chambers, and one of the plurality of second treatment chambers each have an arm for transporting the substrate. The arm of the first transfer device, the second transfer device, one of the plurality of first treatment chambers, and one of the plurality of second treatment chambers has a rotation axis for rotating the substrate from a horizontal state to a vertical state or reversely.

The plurality of first treatment chambers is arranged radiatively with the first delivery chamber as a center.

The plurality of first treatment chambers is arranged radiatively with the first delivery chamber as a center, and the plurality of second treatment chambers is arranged radiatively with the second delivery chamber as a center The first to fifth ports each have airtightness.

The manufacturing apparatus further possesses an inlet/outlet for a substrate at the first port of the first or second transfer device located at a terminal of the main transporting route. Input of the substrate before treatment and output of the substrate after treatment are each performed through the inlet/outlet.

The manufacturing apparatus further possesses: an inlet for a substrate at the first port of the first or second transfer device located at one of terminals of the main transporting route; and an outlet for a substrate at the first port of the first or second transfer device located at the other terminal of the main transporting route. Input of the substrate before treatment is performed through the inlet, and output of the substrate after treatment are performed through the outlet.

The manufacturing apparatus further possesses an inlet/outlet for a substrate at the first port of the first or second transfer device on the main transporting route. The main transporting route has a cyclic path passing through the first transfer device, the first transporting chamber, the second transfer device, and the inlet/outlet. Input of the substrate before treatment and output of the substrate after treatment are each performed through the inlet/outlet.

The main transporting route has an unicursal shape.

A plurality of first transporting chambers is provided in parallel.

An embodiment of the present invention is a manufacturing method of stacked layers with a manufacturing apparatus. The manufacturing apparatus includes: a main transporting route having first and second transfer devices connected through a first transporting chamber; a sub-transporting route extending in a direction intersecting the main transporting route, the sub-transporting route having second transporting chamber connected to the first or second transfer device and a delivery chamber connected to the second transfer chamber; and a plurality of first treatment chambers connected to the delivery chamber. The manufacturing method includes: preparing a substrate to be treated, the substrate having, over an insulating surface, a pixel electrode and a bank covering an edge portion of the pixel electrode and exposing a part of an upper surface of the pixel electrode; transporting the substrate to the first transfer device provided on the main transporting route of the manufacturing apparatus; transporting the substrate from the first transfer device to the delivery chamber through the second transporting chamber; transporting the substrate from the delivery chamber to one of the first treatment chambers; forming a first organic layer over the pixel electrode and the bank while maintaining the substrate in a horizontal state; returning the substrate from the one of the first treatment chambers to the delivery chamber; returning the substrate from the delivery chamber to another one of the first treatment chambers; forming a second organic layer over the first organic layer in a region overlapping with the pixel electrode while maintaining the substrate in a vertical state; returning the substrate from the another one of the plurality of first treatment chambers to the delivery chamber; and returning the substrate from the delivery chamber to the first transfer device through the second transporting chamber. The manufacturing method further includes a step of rotating the substrate from the horizontal state to the vertical state while the substrate is transported from the delivery chamber to the another one of the plurality of first treatment chambers.

Another embodiment of the present invention is a manufacturing method of stacked layers with a manufacturing apparatus. The manufacturing apparatus includes: a main transporting route having first and second transfer devices connected through a first transporting chamber; a first sub-transporting route extending in a direction intersecting the main transporting route, the first sub-transporting having a second transporting chamber connected to the first transfer device and a first delivery chamber connected to the second transporting chamber; a second sub-transporting route extending in a direction intersecting the main transporting route, the second sub-transporting route having a third transporting chamber connected to the second transfer device and a second delivery chamber connected to the third transporting chamber; a plurality of first treatment chambers connected to the first delivery chamber; and a plurality of second treatment chambers connected to the second transporting chamber. The manufacturing method includes: preparing a substrate to be treated, the substrate having, over an insulating surface, a pixel electrode and a bank covering an edge portion of the pixel electrode and exposing a part of an upper surface of the pixel electrode; transporting the substrate to the first transfer device provided on the main transporting route of the manufacturing apparatus; transporting the substrate from the first transfer device to the first delivery chamber through the second transporting chamber; transporting the substrate from the first delivery chamber to one of the first treatment chambers; forming a first organic layer over the pixel electrode and the bank while maintaining the substrate in a horizontal state; returning the substrate from the one of the first treatment chambers to the first delivery chamber; returning the substrate from the first delivery chamber to the first transfer device through the second transporting chamber; transporting the substrate from the first transfer device to the second transfer device through the first transporting chamber; transporting the substrate from the second transfer device to the second delivery chamber through the third transporting chamber; transporting the substrate from the second delivery chamber to one of the second treatment chambers; forming a second organic layer over the first organic layer in a region overlapping with the pixel electrode while maintaining the substrate in a vertical state; returning the substrate from the one of the plurality of second treatment chambers to the second delivery chamber; and returning the substrate from the second delivery chamber to the second transfer device through the third transporting chamber. The manufacturing method further includes a step of rotating the substrate from the horizontal state to the vertical state while the substrate is transported from the second delivery chamber to the second transporting chamber or from the second delivery chamber to the one of the plurality of second treatment chambers.

The first organic layer includes a hole-transporting layer or an electron-transporting layer of a light-emitting element.

The second organic layer includes an emission layer of a light-emitting element.

What is claimed is:

1. A manufacturing method of a light emitting device using a manufacturing apparatus comprising a first treatment chamber and a second treatment chamber, the manufacturing method comprising steps of:
    preparing a substrate to be treated, the substrate comprising an insulating surface, a plurality of pixel electrodes on the insulating surface, and a bank covering edge portions of the plurality of pixel electrodes and exposing each of upper surfaces of the plurality of pixel electrodes;
    transporting the substrate into the first treatment chamber;
    forming a first organic layer over the upper surfaces of the plurality of pixel electrodes while holding the substrate so that the insulating surface faces a direction parallel to gravity;
    returning the substrate from the first treatment chamber;
    transporting the substrate into the second treatment chamber; and
    forming a second organic layer over the first organic layer in a region overlapping one of the upper surfaces of the plurality of pixel electrodes while holding the substrate so that the insulating surface faces a direction perpendicular to gravity.

2. The manufacturing method according to claim 1, wherein
    the first organic layer includes a hole injection layer or a hole transport layer.

3. The manufacturing method according to claim 1, wherein
    the second organic layer includes a light emitting layer.

4. The manufacturing method according to claim 1, further comprising a step of rotating the substrate from a state where the insulating surface faces the direction parallel to gravity to a state where the insulating surface faces the direction perpendicular to gravity, wherein
    the rotating step is performed after returning the substrate from the first treatment chamber and before forming the second organic layer.

5. A manufacturing method of a light emitting device using a manufacturing apparatus comprising a first treatment chamber, a second treatment chamber, and a third treatment chamber, the manufacturing method comprising steps of:
    preparing a substrate to be treated, the substrate comprising an insulating surface, a plurality of pixel electrodes on the insulating surface, and a bank covering edge portions of the plurality of pixel electrodes and exposing each of upper surfaces of the plurality of pixel electrodes;
    transporting the substrate into the first treatment chamber;
    forming a first organic layer over the upper surfaces of the plurality of pixel electrodes while holding the substrate so that the insulating surface faces a direction parallel to gravity;
    returning the substrate from the first treatment chamber;
    transporting the substrate into the second treatment chamber;
    forming a second organic layer over the first organic layer in a region overlapping one of the upper surfaces of the plurality of pixel electrodes while holding the substrate so that the insulating surface faces a direction perpendicular to gravity;
    returning the substrate from the second treatment chamber;
    transporting the substrate into the third treatment chamber; and
    forming a third organic layer over the first organic layer in a region overlapping another one of the upper surfaces of the plurality of pixel electrodes while holding the substrate so that the insulating surface faces the direction perpendicular to gravity.

6. The manufacturing method according to claim 5, wherein
    the first organic layer continuously covers the one of the upper surfaces of the plurality of pixel electrodes and the another one of the upper surfaces of the plurality of pixel electrodes.

7. The manufacturing method according to claim 5, wherein
    the first organic layer includes a hole injection layer or a hole transport layer.

8. The manufacturing method according to claim 5, wherein
    the second organic layer includes a light emitting layer which emits light of a first emitting color, and
    the third organic layer includes a light emitting layer which emits light of a second emitting color different from the first emitting color.

9. The manufacturing method according to claim 5, further comprising a step of rotating the substrate from a state where the insulating surface faces the direction parallel to gravity to a state where the insulating surface faces the direction perpendicular to gravity, wherein
    the rotating step is performed after returning the substrate from the first treatment chamber and before forming the second organic layer.

10. The manufacturing method according to claim 5, further comprising steps of:
    rotating the substrate from a state where the insulating surface faces the direction perpendicular to gravity to a state where the insulating surface faces the direction parallel to gravity; and
    rotating the substrate from the state where the insulating surface faces the direction parallel to gravity to the state where the insulating surface faces the direction perpendicular to gravity, wherein
    the rotating steps are performed after returning the substrate from the second treatment chamber and before forming the third organic layer.

* * * * *